(12) United States Patent
Jee et al.

(10) Patent No.: US 12,260,791 B2
(45) Date of Patent: Mar. 25, 2025

(54) DISPLAY DEVICE AND METHOD OF INSPECTING THE SAME

(71) Applicant: SAMSUNG DISPLAY CO., LTD., Yongin-si (KR)

(72) Inventors: Ahnho Jee, Hwaseong-si (KR); Sang-Woo Park, Cheonan-si (KR); Sungho Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 154 days.

(21) Appl. No.: 18/148,223

(22) Filed: Dec. 29, 2022

(65) Prior Publication Data
US 2023/0230517 A1  Jul. 20, 2023

(30) Foreign Application Priority Data
Jan. 14, 2022  (KR) .................. 10-2022-0005925

(51) Int. Cl.
*G09G 3/00* (2006.01)
*H10K 59/121* (2023.01)
*H10K 59/131* (2023.01)

(52) U.S. Cl.
CPC ......... *G09G 3/006* (2013.01); *H10K 59/1213* (2023.02); *H10K 59/131* (2023.02)

(58) Field of Classification Search
CPC .................................................... G01R 31/002
See application file for complete search history.

(56) References Cited

U.S. PATENT DOCUMENTS

| | | | |
|---|---|---|---|
| 10,964,612 B2 | 3/2021 | Lee et al. | |
| 10,997,883 B2 | 5/2021 | Kang et al. | |
| 11,108,012 B2 | 8/2021 | Zhou et al. | |
| 11,183,089 B2 | 11/2021 | Ryu | |
| 2014/0300649 A1* | 10/2014 | Park | G09G 3/3208 345/690 |
| 2021/0257592 A1 | 8/2021 | Lee et al. | |

FOREIGN PATENT DOCUMENTS

| | | | |
|---|---|---|---|
| CN | 208433410 U | * | 1/2019 |
| CN | 113358707 | | 9/2021 |
| KR | 10-2019-0110167 | | 9/2019 |
| KR | 10-2020-0039896 | | 4/2020 |
| KR | 10-2020-0077254 | | 6/2020 |
| KR | 10-2021-0105451 | | 8/2021 |

\* cited by examiner

*Primary Examiner* — Tung X Nguyen
(74) *Attorney, Agent, or Firm* — F. Chau & Associates, LLC

(57) ABSTRACT

A display device includes a display layer including an active area in which a plurality of pixels is arranged and a peripheral area located adjacent to the active area. The display layer includes a transistor disposed in the active area and including a gate, a source, and a drain, a first crack line disposed in the peripheral area and surrounding a portion of the active area in a plan view, and a second crack line disposed in the peripheral area under the first crack line. The first crack line is insulated from the second crack line.

18 Claims, 12 Drawing Sheets

DISPLAY DEVICE AND METHOD OF INSPECTING THE SAME

CROSS-REFERENCE TO RELATED APPLICATIONS

This U.S. non-provisional patent application claims priority under 35 U.S.C. § 119 to Korean Patent Application No. 10-2022-0005925, filed on Jan. 14, 2022, the disclosure of which is incorporated by reference in its entirety herein.

1. TECHNICAL FIELD

The present disclosure relates to a display device capable of inspecting a defect thereof and a method of inspecting the display device.

2. DISCUSSION OF RELATED ART

With the recent development of display device technology, a display device including a flexible display panel is being developed. A flexible display device includes a flexible display panel with pixels for displaying images and a driving chip for driving the pixels. The pixels are disposed in a display area of the display panel, and the driving chip is disposed in a non-display area surrounding the display area. A bending portion is defined between the driving chip and the display area, and the bending portion is bent to allow the driving chip to be disposed under the display panel.

An inspection that detect defects and cracks of the display device should be performed after manufacture to reduce a process defect rate of the display device.

SUMMARY

At least one embodiment of the present disclosure provides a display device with increased defect inspection reliability.

At least one embodiment of the present disclosure provides a method for inspecting the display device.

An embodiment of the inventive concept provides a display device including a display layer including an active area in which a plurality of pixels is arranged and a peripheral area located adjacent to the active area. The display layer includes a transistor disposed in the active area and including a gate, a source, and a drain, a first crack line and a second crack line. The first crack line is disposed in the peripheral area and surrounds a portion of the active area in a plan view. The second crack line is disposed in the peripheral area under the first crack line. The first crack line is insulated from the second crack line.

In an embodiment, the first crack line overlaps the second crack line in a plan view.

The display layer may further include an insulating layer disposed between the first crack line and the second crack line.

In an embodiment, at least one of the first crack line and the second crack line is disposed on a same layer as the transistor.

The second crack line may surround the portion of the active area in a plan view.

In an embodiment, the active area includes a pattern hole, and the first crack line surrounds a portion of the pattern hole.

In an embodiment, the display layer further includes a driving circuit electrically connected to the transistor, the peripheral area includes a first area, a second area spaced apart from the first area in a first direction, and a bending area disposed between the first area and the second area, where the first area is located adjacent to the active area, and the driving circuit is disposed in the second area.

In an embodiment, each of the first crack line and the second crack line is disposed in the first area, the second area, and the bending area.

The display device may further include a sensor layer disposed on the display layer for sensing an external input, and including a plurality of conductive layers.

An embodiment of the inventive concept provides a method of inspecting a display device. The method includes providing a display device including a display layer including an active area in which a plurality of pixels is arranged and a peripheral area located adjacent to the active area and including a transistor disposed in the active area and including a gate, a source, and a drain, a first crack line, a second crack line, and an insulating layer. The first crack line is disposed in the peripheral area and surrounds a portion of the active area in a plan view. The second crack line is disposed in the peripheral area under the first crack line. The insulating layer is disposed between the first crack line and the second crack line. The method further includes detecting whether a defect occurs in the display device based on at least one of the first crack line and the second crack line, and analyzing a position where the defect occurs based on a Wheatstone bridge.

The analyzing of the position of the defect may be performed using a Murray loop test.

The method may include detecting whether a first defect of the first crack line occurs based on the first crack line and detecting whether a second defect of the insulating layer occurs based on the first crack line and the second crack line.

The analyzing of the position of the defect may include analyzing a position of the second defect occurring in the insulating layer.

The analyzing of the position of the defect may include electrically connecting a detector including a Murray loop tester to the first crack line.

The analyzing of the position of the defect may include connecting the second crack line to a ground voltage.

The analyzing of the position of the defect may include detecting a position where excessive heat is generated in the first crack line.

An embodiment of the inventive concept provides a method of inspecting a display device. The method includes providing a display device including a display layer including an active area in which a plurality of pixels is arranged and a peripheral area located adjacent to the active area and including a first crack line disposed in the peripheral area and surrounding a portion of the active area in a plan view, and a second crack line disposed in the peripheral area under the first crack line. The method includes detecting whether a defect occurs in the display layer based on the first crack line and the second crack line, and analyzing a position where the defect occurs based on a Murray loop test.

The analyzing of the position of the defect may include connecting the second crack line to a ground voltage.

The analyzing of the position of the defect may include connecting the first crack line to a detector and allowing the first crack line and the detector to form a Wheatstone bridge.

The analyzing of the position of the defect may include detecting a position where excessive heat is generated in the first crack line.

In an embodiment, the detector is electrically connected to both ends of the first crack line and measures a current and/or a resistance. When an open current and/or an open resistance are measured, the detector determines that a defect occurs in the display device. When a short-circuit current and/or a short-circuit resistance are measured, the detector determines that a defect occurs in the display device. Accordingly, a display device with increased defect inspection reliability and a method of inspecting the display device are provided.

In addition, a user may use the detected defect of the display device to reduce a process defect rate of the display device. The position at which the defect occurs may be determined based on a length of the first crack line, which may be calculated according to a method of inspecting the display device using the Murray loop test. Further, a manufacturing process of the display device may be corrected based on the detected defect position to prevent future defects from occurring at the same position. Accordingly, the reliability of the manufacturing process of the display device and the reliability of the inspection method of the display device may be increased.

BRIEF DESCRIPTION OF THE DRAWINGS

The present disclosure will become readily apparent by reference to the following detailed description when considered in conjunction with the accompanying drawings wherein.

DETAILED DESCRIPTION

Figure 1:
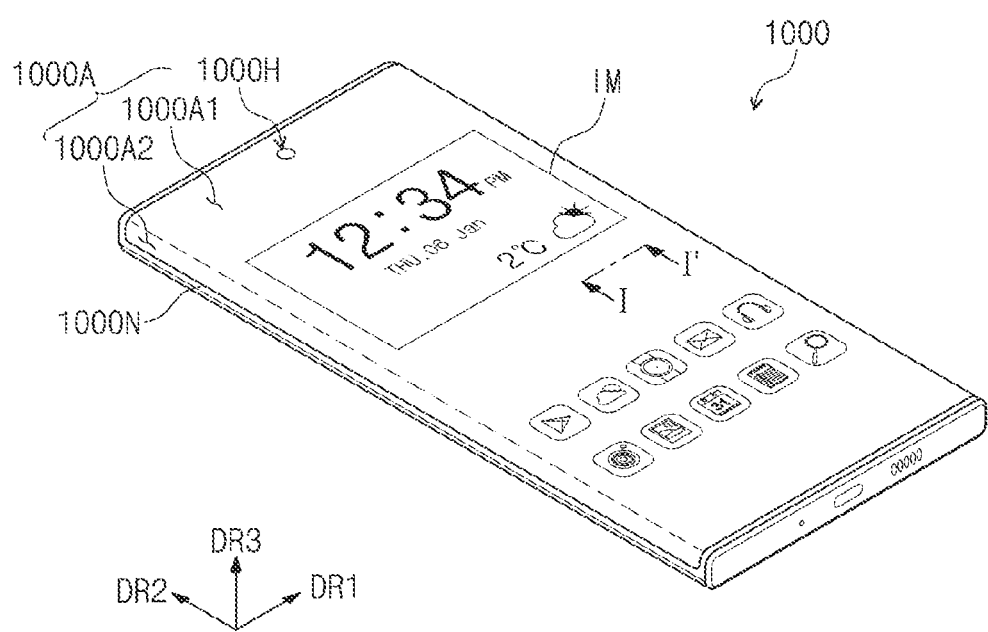
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described with reference to accompanying drawings.

FIG. 1 is a perspective view of a display device 1000 according to an embodiment of the present disclosure.

Referring to FIG. 1, the display device 1000 may include a large-sized electronic item, such as a television set, a monitor, or an outdoor billboard. The display device 1000 may include a small and medium-sized electronic item, such as a personal computer, a notebook computer, a personal digital assistant, a car navigation unit, a game unit, a smartphone, a tablet computer, and a camera. However, these are merely examples, and the display device 1000 may include other electronic devices capable of supporting the concept of the present disclosure. FIG. 1 shows a mobile phone as a representative example of the display device 1000.

The display device 1000 may include an active area 1000A and a peripheral area 1000N, which are defined therein. The active area 1000A may display an image IM. The active area 1000A may include a first display surface 1000A1 substantially parallel to a plane defined by a first direction DR1 and a second direction DR2 crossing the first direction DR1 and a second display surface 1000A2 extending from the first display surface 1000A1.

The second display surface 1000A2 may be bent from one side of the first display surface 1000A1. In addition, the second display surface 1000A2 may be provided in plural. In this case, the second display surfaces 1000A2 may be bent from at least two sides of the first display surface 1000A1. The active area 1000A may include one first display surface 1000A1 and one second display surface 1000A2 or more and four second display surfaces 1000A2 or less, however, the shape of the active area 1000A is not limited thereto. According to an embodiment, the active area 1000A includes only the first display surface 1000A1.

The peripheral area 1000N may be defined adjacent to the active area 1000A. The peripheral area 1000N may be referred to as a bezel area.

A hole area 1000H may be surrounded by the active area 1000A. The hole area 1000H may be an area through which an optical signal is transmitted or received. As an example, electronic parts may be arranged in the hole area 1000H.

A thickness direction of the display device 1000 may be substantially parallel to a third direction DR3 crossing the first direction DR1 and the second direction DR2. Accordingly, front (or upper) and rear (or lower) surfaces of each member of the display device 1000 may be defined with respect to the third direction DR3.

Figure 2A:
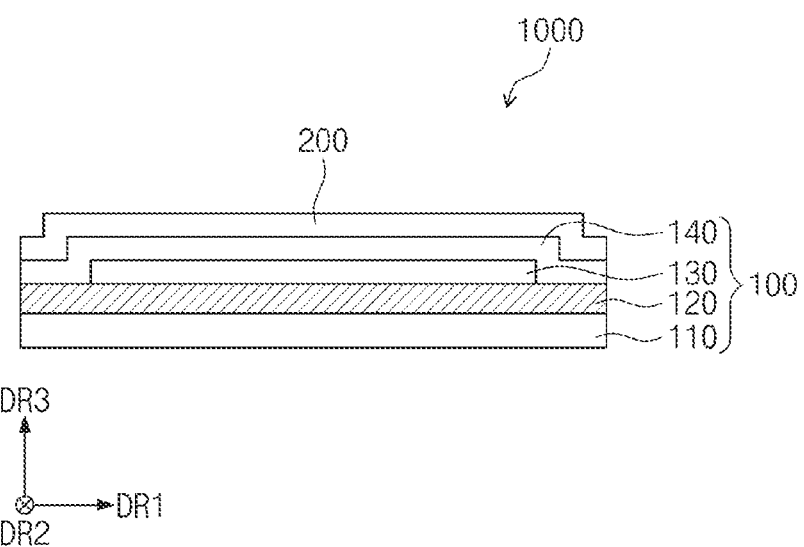
FIG. 2A is a cross-sectional view of a display device according to an embodiment of the present disclosure.

FIG. 2A is a cross-sectional view of the display device 1000 according to an embodiment of the present disclosure.

Referring to FIG. 2A, the display device 1000 may include a display layer 100 and a sensor layer 200.

The display layer 100 may have a configuration that substantially generates the image IM (refer to FIG. 1). The display layer 100 may be a light emitting type display layer. As an example, the display layer 100 may be an organic light emitting display layer, a quantum dot display layer, a micro light-emitting-diode (micro-LED) display layer, or a nano-LED display layer. The display layer 100 may include a base layer 110, a circuit layer 120, a light emitting element layer 130, and an encapsulation layer 140.

The base layer 110 may include a base surface on which the circuit layer 120 is disposed. The base layer 110 may be a glass substrate, a metal substrate, or a polymer substrate. However, embodiment of the disclosure are not limited thereto. For example, the base layer 110 may be an inorganic layer, an organic layer, or a composite material layer.

The base layer 110 may have a multi-layer structure. For instance, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the present disclosure, the term "X-based resin", as used herein, refers to the resin that includes a functional group of X.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. The photolithography processes may form the semiconductor pattern, the conductive pattern, and the signal line that are included in the circuit layer 120.

The light emitting element layer 130 may be disposed on the circuit layer 120. The light emitting element layer 130 may include a light emitting element. For example, the light emitting element layer 130 may include an organic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles.

The sensor layer 200 may be disposed on the display layer 100. The sensor layer 200 may sense an external input applied thereto from the outside.

The sensor layer 200 may be formed on the display layer 100 through successive processes. In this case, the sensor layer 200 may be disposed directly on the display layer 100. When the sensor layer 200 is disposed directly on the display layer 100, no intervening elements are present between the sensor layer 200 and the display layer 100. That is, a separate adhesive member is not disposed between the sensor layer 200 and the display layer 100. Alternatively, the sensor layer 200 may be coupled with the display layer 100 by an adhesive layer. The adhesive layer may include an adhesive material.

Figure 2B:
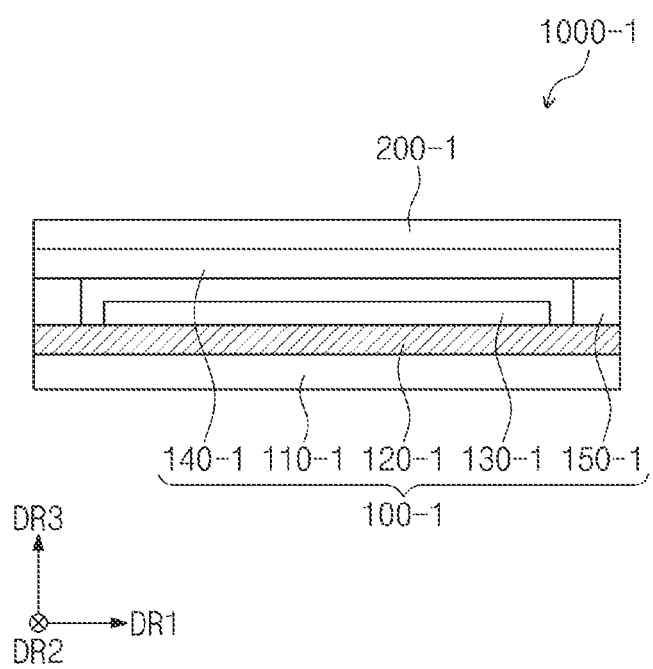
FIG. 2B is a cross-sectional view of a display device according to an embodiment of the present disclosure.

FIG. 2B is a cross-sectional view of a display device 1000-1 according to an embodiment of the present disclosure. The display device 1000-1 may be used to implement the display device 1000 of FIG. 1.

Referring to FIG. 2B, the display device 1000-1 may include a display layer 100-1 and a sensor layer 200-1.

The display layer 100-1 may include a base substrate 110-1, a circuit layer 120-1, a light emitting element layer 130-1, an encapsulation substrate 140-1, and a coupling member 150-1.

Each of the base substrate 110-1 and the encapsulation substrate 140-1 may be a glass substrate, a metal substrate, or a polymer substrate. However, embodiments of the present disclosure are not limited thereto.

The coupling member 150-1 may be disposed between the base substrate 110-1 and the encapsulation substrate 140-1. The encapsulation substrate 140-1 may be coupled with the base substrate 110-1 or the circuit layer 120-1 by the coupling member 150-1. The coupling member 150-1 may include an inorganic material or an organic material. For example, the inorganic material may include a frit seal, and the organic material may include a photocurable resin or a photoplastic resin. However, the material for the coupling member 150-1 is not limited thereto.

The sensor layer 200-1 may be disposed directly on the encapsulation substrate 140-1. When the sensor layer 200-1 is disposed directly on the encapsulation substrate 140-1, no intervening elements are present between the sensor layer 200-1 and the encapsulation substrate 140-1. That is, a separate adhesive member is not disposed between the sensor layer 200-1 and the encapsulation substrate 140-1. However, the sensor layer 200-1 is not limited to being disposed directly on the encapsulation substrate 140-1. According to an embodiment, an adhesive layer is further disposed between the sensor layer 200-1 and the encapsulation substrate 140-1.

Figure 3:
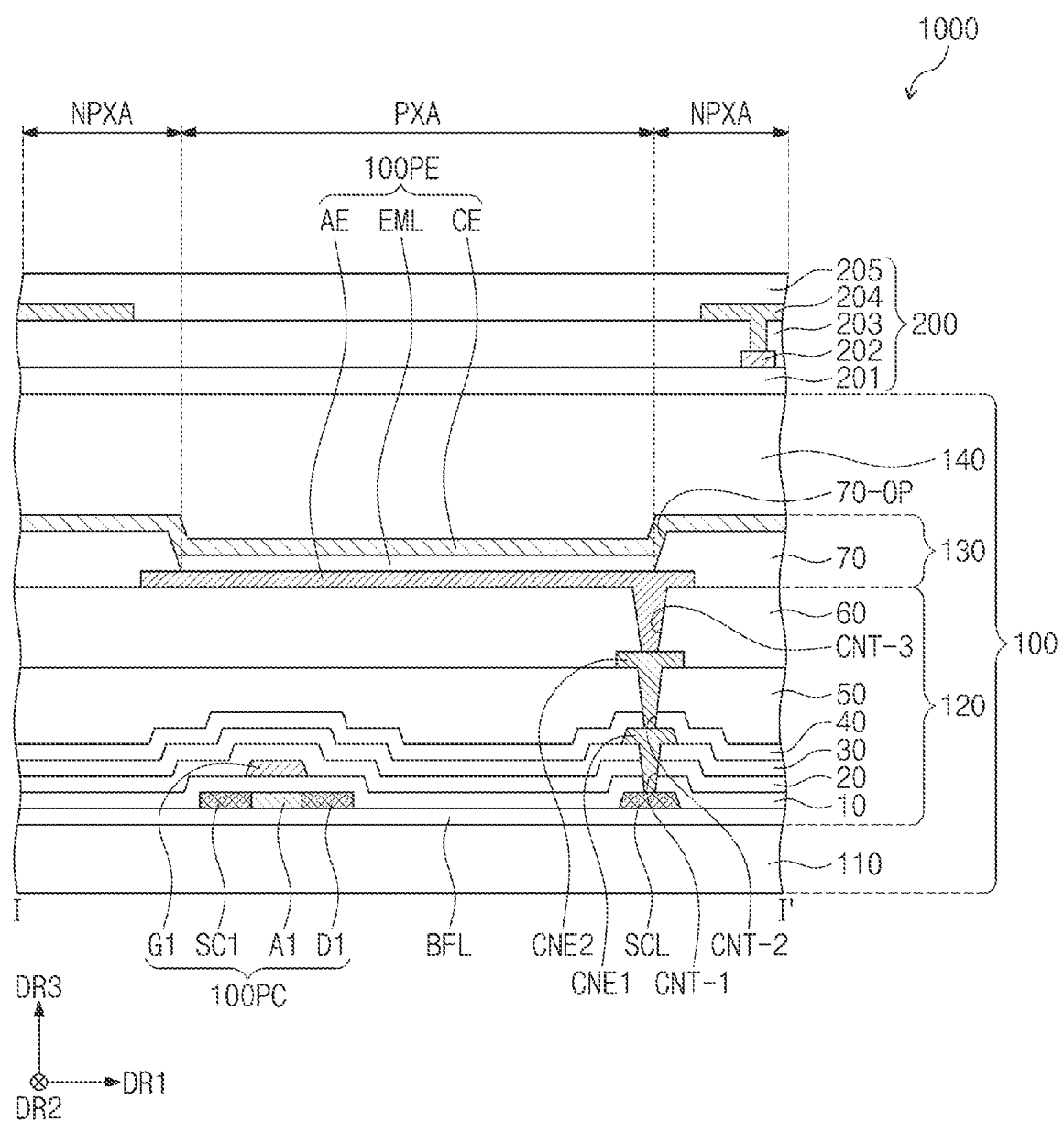
FIG. 3 is a cross-sectional view of a display device taken along a line I-I' of FIG. 1 according to an embodiment of the present disclosure.

FIG. 3 is a cross-sectional view of the display device 1000 taken along a line I-I' of FIG. 1 according to an embodiment of the present disclosure. In FIG. 3, the same reference numerals denote the same elements in FIG. 2A, and thus, detailed descriptions of the same elements will be omitted.

Referring to FIG. 3, at least one inorganic layer may be formed on an upper surface of the base layer 110. The inorganic layer may include at least one of aluminum oxide, titanium oxide, silicon oxide, silicon oxynitride, zirconium oxide, and hafnium oxide. The inorganic layer may be formed in multiple layers. The inorganic layers formed in multiple layers may form a barrier layer and/or a buffer layer. In the present embodiment, the display layer 100 may include a buffer layer BFL.

The buffer layer BFL may increase an adhesion between the base layer 110 and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon, but is not limited thereto. The semiconductor pattern may include amorphous silicon, low-temperature polycrystalline silicon, or oxide semiconductor.

FIG. 3 shows only a portion of the semiconductor pattern, and the semiconductor pattern may be further disposed in other areas. The semiconductor pattern may be arranged with a specific rule over the pixels. The semiconductor pattern may have different electrical properties depending on whether it is doped or not or whether it is doped with an N-type dopant or a P-type dopant. The semiconductor pattern may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than the first region.

The first region may have a conductivity greater than that of the second region and may substantially serve as an electrode or a signal line. The second region may substantially correspond to an active (or a channel) of a transistor. In other words, a portion of the semiconductor pattern may be the active of the transistor, another portion of the semiconductor pattern may be a source or a drain of the transistor, and the other portion of the semiconductor pattern may be a connection electrode or a connection signal line.

Each of the pixels may have an equivalent circuit that includes seven transistors, one capacitor, and the light emitting element, and the equivalent circuit of the pixels may be changed in various ways. FIG. 3 shows one transistor 100PC and the light emitting element 100PE included in the pixel.

The transistor 100PC may include a source SC1, an active A1, a drain D1, and a gate G1. The source SC1, the active A1, and the drain D1 may be formed from the semiconductor pattern. The source SC1 and the drain D1 may extend in opposite directions to each other from the active A1 in a cross-section. FIG. 3 shows a portion of the connection signal line SCL formed from the semiconductor pattern. Although not shown in figures, the connection signal line SCL may be electrically connected to the drain D1 of the transistor 100PC in a plane.

A first insulating layer 10 may be disposed on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In the present embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, but is not limited thereto.

The gate G1 of the transistor 100PC may be disposed on the first insulating layer 10. The gate G1 may be a portion of a metal pattern. The gate G1 may overlap the active A1. The gate G1 may be used as a mask in a process of doping the semiconductor pattern.

A second insulating layer 20 may be disposed on the first insulating layer 10 and may cover the gate G1. The second insulating layer 20 may commonly overlap the pixels. The second insulating layer 20 may be an inorganic layer and/or an organic layer and may have a single-layer or multi-layer structure. The second insulating layer 20 may include at least one of silicon oxide, silicon nitride, and silicon oxynitride. In the present embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. As an example, the third insulating layer 30 may have the multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, a quantum dot, a quantum rod, a micro-LED, or a nano-LED. Hereinafter, the organic light emitting element will be described as the light emitting element 100PE, however, the light emitting element 100PE should not be particularly limited.

The light emitting element 100PE may include a first electrode AE, a light emitting layer EML, and a second electrode CE. The first electrode AE may be disposed on the sixth insulating layer 60. The first electrode AE may be connected to the second connection electrode CNE2 via a contact hole CNT-3 defined through the sixth insulating layer 60.

A pixel definition layer 70 may be disposed on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The active area 1000A (refer to FIG. 1) may include a light emitting area PXA and a non-light-emitting area NPXA adjacent to the light emitting area PXA. The non-light-emitting area NPXA may surround the light emitting area PXA. In the present embodiment, the light emitting area PXA may correspond to the portion of the first electrode AE exposed through the opening 70-OP.

The light emitting layer EML may be disposed on the first electrode AE. The light emitting layer EML may be disposed in an area corresponding to the opening 70-OP. That is, the light emitting layer EML may be formed in each of the pixels after being divided into plural portions. In the case where the light emitting layer EML is formed in each of the pixels after being divided into plural portions, each of the light emitting layers EML may emit a light having at least one of blue, red, and green colors, but is not limited thereto. The light emitting layer EML may be commonly provided in the pixels. In this case, the light emitting layer EML may provide a blue light or a white light.

The second electrode CE may be disposed on the light emitting layer EML. The second electrode CE may have an integral shape and may be commonly disposed over the pixels. For example, the second electrode CE may be a single uniform layer that is not divided into a plural portions like the light emitting layer EML. The second electrode CE may be referred to as a common electrode CE.

Although not shown in figures, a hole control layer may be disposed between the first electrode AE and the light emitting layer EML. The hole control layer may be commonly disposed in the light emitting area PXA and the non-light-emitting area NPXA. The hole control layer may include a hole transport layer and may further include a hole injection layer. An electron control layer may be disposed between the light emitting layer EML and the second electrode CE. The electron control layer may include an electron transport layer and may further include an electron injection layer. The hole control layer and the electron control layer may be commonly formed in the plural pixels using an open mask.

The encapsulation layer 140 may be disposed on the light emitting element layer 130. The encapsulation layer 140 may include an inorganic layer, an organic layer, and an inorganic layer, which are sequentially stacked, but layers of the encapsulation layer 140 is not limited thereto.

The inorganic layers may protect the light emitting element layer 130 from moisture and oxygen, and the organic layer may protect the light emitting element layer 130 from a foreign substance such as dust particles. Each of the inorganic layers may include a silicon nitride layer, a silicon oxynitride layer, a silicon oxide layer, a titanium oxide layer, or an aluminum oxide layer. The organic layer may include an acrylic-based organic layer, but is not limited thereto.

The sensor layer 200 may be formed on the display layer 100 through successive processes. That is, the sensor layer 200 may be disposed directly on the display layer 100. When the sensor layer 200 is disposed directly on the display layer 100, no intervening elements are present between the sensor layer 200 and the display layer 100. That is, a separate adhesive member is not disposed between the sensor layer 200 and the display layer 100. Alternatively, the sensor layer 200 may be coupled with the display layer 100 by an adhesive layer. The adhesive layer may include an adhesive material.

The sensor layer 200 may include a base insulating layer 201, a first conductive layer 202, a sensing insulating layer 203, a second conductive layer 204, and a cover insulating layer 205.

The base insulating layer 201 may be an inorganic layer that includes at least one of silicon nitride, silicon oxynitride, and silicon oxide. Alternatively, the base insulating layer 201 may be an organic layer that includes an epoxy-based resin, an acrylic-based resin, or an imide-based resin. The base insulating layer 201 may have a single-layer structure or a multi-layer structure of layers stacked one on another in the third direction DR3.

Each of the first conductive layer 202 and the second conductive layer 204 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include a conductive polymer such as PEDOT, a metal nanowire, a graphene, or the like. In an embodiment, the conductive polymer is poly(3,4-ethylenedioxythiophene) polystyrene sulfonate.

The conductive layer having the multi-layer structure may include metal layers. The metal layers may have, for example, a three-layer structure of titanium/aluminum/titanium. The conductive layer having the multi-layer structure may include at least one metal layer and at least one transparent conductive layer.

At least one of the sensing insulating layer 203 and the cover insulating layer 205 may include an inorganic layer. The inorganic layer may include at least one of aluminum oxide, titanium oxide, silicon oxide, silicon nitride, silicon oxynitride, zirconium oxide, and hafnium oxide.

At least one of the sensing insulating layer 203 and the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 4:
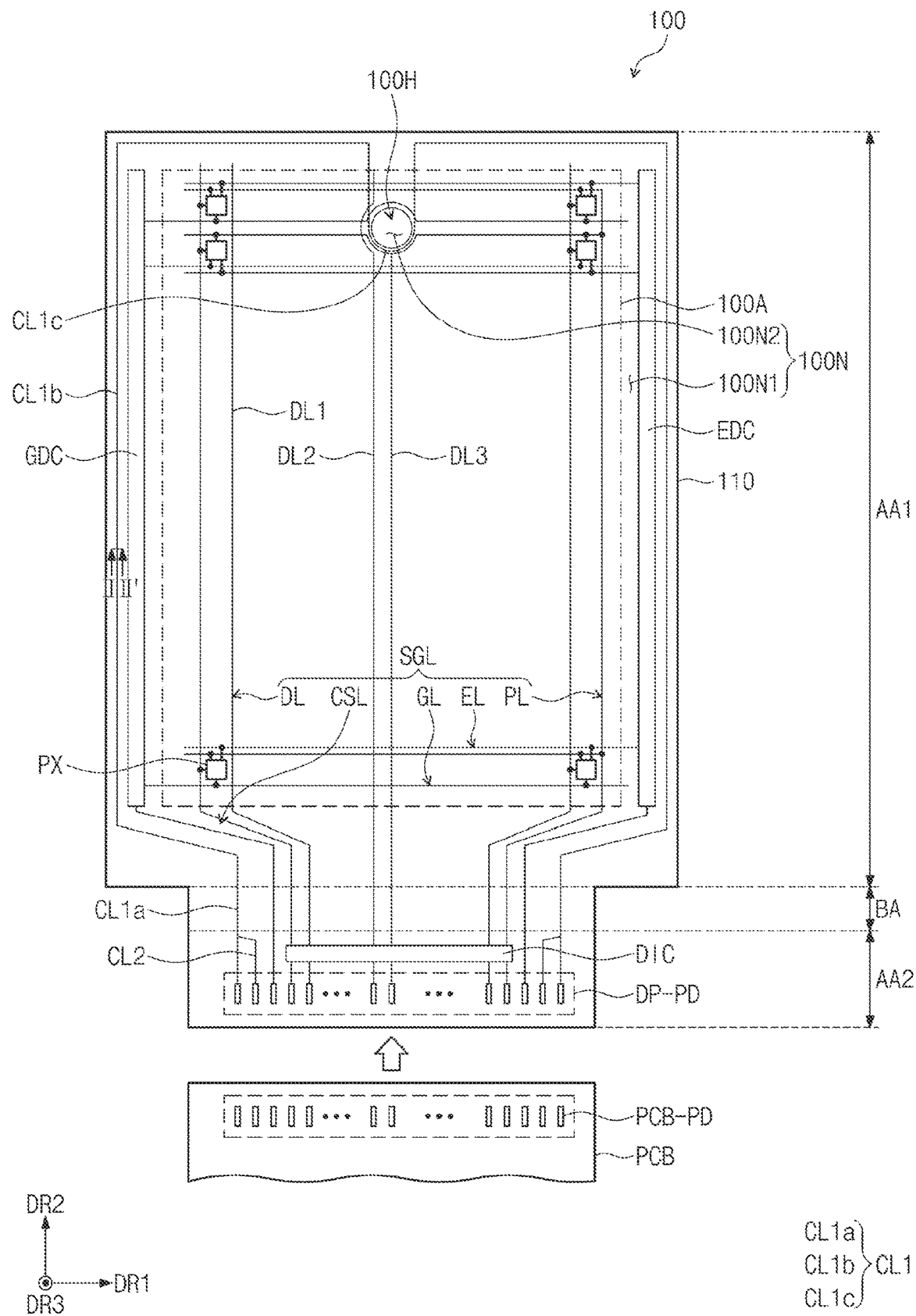
FIG. 4 is a plan view of a display layer according to an embodiment of the present disclosure.

FIG. 4 is a plan view of the display layer according to an embodiment of the present disclosure.

Referring to FIG. 4, the display layer 100 may include an active area 100A and a peripheral area 100N located adjacent to the active area 100A. The active area 100A may be an area in which an image is displayed. A plurality of pixels PX may be arranged in the active area 100A. The peripheral area 100N may include a first peripheral area 100N1 and a second peripheral area 100N2. The first peripheral area 100N1 may surround the active area 100A. A driving circuit or a driving line may be disposed in the first peripheral area 100N1. The active area 100A may surround the second peripheral area 100N2. A pattern hole 100H may be defined in the second peripheral area 100N2. An optical signal may be transmitted through the second peripheral area 100N2. In an embodiment, the second peripheral area 100N2 has a light transmittance higher than that of the active area 100A.

When viewed in a plane or a plan view, the active area 100A may overlap the active area 1000A (refer to FIG. 1) of the display device 1000 (refer to FIG. 1), and the first peripheral area 100N1 may overlap the peripheral area 1000N (refer to FIG. 1) of the display device 1000 (refer to FIG. 1). The second peripheral area 100N2 may overlap the hole area 1000H (refer to FIG. 1) of the display device 1000 (refer to FIG. 1).

The display layer 100 may include the base layer 110, the pixels PX, a plurality of signal lines SGL, a scan driver GDC, a data driver DIC, and a light emission driver EDC.

The display layer 100 may be, but is not limited to, a flexible display layer. As an example, the display layer 100 may include a plurality of electronic elements disposed on the flexible base layer 110. The display layer 100 may extend longer in the second direction DR2 than in the first direction DR1. The display layer 100 may include a plane defined by the first direction DR1 and the second direction DR2.

The display layer 100 may include a first area AA1, a second area AA2, and a bending area BA disposed between the first area AA1 and the second area AA2. The bending area BA may extend in the first direction DR1. The first area AA1, the bending area BA, and the second area AA2 may be arranged in the second direction DR2. The bending area BA may be bent toward a rear surface of the base layer 110, and in this case, the first area AA1 and the second area AA2 may face each other.

The first area AA1 may include long sides extending in the second direction DR2 and spaced apart from each other in the first direction DR1. The bending area BA and the second area AA2 may have a length less than a length of the first area AA1 in the first direction DR1.

The first area AA1 may include the active area 100A, the first peripheral area 100N1 around the active area 100A, and the second peripheral area 100N2. An image may not be displayed in the second area AA2 and the bending area BA.

The pixels PX may be arranged in the active area 100A. Each of the pixels PX may display one of primary colors or a mixed color of the primary colors. The primary colors may include red, green, and blue colors. The mixed color may include various colors, e.g., white, yellow, cyan, or magenta. However, the colors displayed by the pixels PX is not limited thereto.

The signal lines SGL may be disposed on the base layer 110. The signal lines SGL may be connected to the pixels PX and may transmit electrical signals to the pixels PX. In an embodiment, the signal lines SGL do not overlap the second peripheral area 100N2. As an example, signal lines SGL adjacent to the second peripheral area 100N2 among the signal lines SGL may be arranged along an outside of a periphery of the second peripheral area 100N2.

The signal lines SGL may include scan lines GL, data lines DL, a power line PL, a control signal line CSL, and light emission lines EL. According to an embodiment, the signal lines SGL may further include separate reset lines.

Each of the scan lines GL may be connected to a corresponding pixel PX among the pixels PX. Each of the data lines DL may be connected to a corresponding pixel PX among the pixels PX. The power line PL may be connected to the pixels PX. Each of the light emission lines EL may be connected to a corresponding pixel PX among the pixels PX. The control signal line CSL may provide control signals to the scan driver GDC.

The scan driver GDC, the data driver DIC, and the light emission driver EDC may be disposed in the peripheral area 100N. The scan driver GDC and the light emission driver EDC may be disposed in the peripheral area 100N adjacent to long sides of the first area AA1. The data driver DIC may be disposed in the second area AA2. The data driver DIC may be referred to as a driving circuit.

The data driver DIC may be mounted on the second area AA2. The data driver DIC may be a timing control circuit in the form of an integrated circuit chip. However, this is merely an example, and according to an embodiment, the data driver DIC may be mounted on a film arranged separately from the display layer 100. In this case, the data driver DIC may be electrically connected to a plurality of pads DP-PD via the film.

The scan lines GL may extend in the first direction DR1 and may be connected to the scan driver GDC. The scan driver GDC may generate a plurality of scan signals in response to a scan control signal. The scan signals may be applied to the pixels PX via the scan lines GL. The scan signals may be sequentially applied to the pixels PX.

The data lines DL may extend in the second direction DR2 and may be connected to the data driver DIC via the bending area BA. The data driver DIC may generate a plurality of data voltages corresponding to image signals in response to a data control signal. The data voltages may be applied to the pixels PX via the data lines DL.

The light emission lines EL may extend in the first direction DR1 and may be connected to the light emission driver EDC. The power line PL may extend in the second direction DR2 and may be disposed in the peripheral area 100N. The light emission driver EDC may generate a plurality of light emission signals in response to a light emission control signal. The light emission signals may be applied to the pixels PX via the light emission lines EL.

When viewed in a plane, the pads DP-PD may be disposed adjacent to a lower end of the second area AA2. The data lines DL, the power line PL, and the control signal line CSL may be connected to the pads DP-PD.

In an embodiment, the display layer 100 further includes a first crack line CL1 and a second crack line CL2. A defect such as a scratch and/or a crack occurring in an outermost portion of the display device 1000 may be detected via the first crack line CL1 and the second crack line CL2. The pads DP-PD may further include pads connected to both ends of the first crack line CL1 and pads connected to both ends of the second crack line CL2.

The first crack line CL1 may be disposed in the first peripheral area 100N1. When viewed in a plane or plan view, a portion of the first crack line CL1 may surround at least a portion of the active area 100A. Another portion of the first crack line CL1 may surround at least a portion of the pattern hole 100H. The first crack line CL1 may include a first portion CL1a, a second portion CL1b, and a third portion CL1c.

The first portion CL1a may extend in the second direction DR2. The first portion CL1a may be disposed in the second area AA2 and the bending area BA. One end of the first portion CL1a may be connected to the pads DP-PD. The other end of the first portion CL1a may be connected to the second portion CL1b. In an embodiment, the second crack line CL2 includes a first portion with a same shape, arrangement and position as the first portion CL1a that is connected to the pads DP-PD, but is spaced apart below the first portion CL1a in the third direction DR3.

The second portion CL1b may extend in the second direction DR2. The second portion CL1b may be disposed in the first area AA1. The second portion CL1b may be disposed adjacent to an outer portion of the display layer 100. The second portion CL1b may be arranged outside the scan driver GDC, the light emission driver EDC, and the power line PL. One end of the second portion CL1b may be connected to the third portion CL1c. In an embodiment, the second crack line CL2 includes a second portion with a same shape, arrangement and position as the second portion CL1b that is connected to the first portion of the second crack line CL2, but is spaced apart below the second portion CL1b in the third direction DR3.

A portion of the third portion CL1c may be disposed in the first peripheral area 100N1 and may extend in the first direction DR1. The other portion of the third portion CL1c may surround at least a portion of the pattern hole 100H. In an embodiment, the second crack line CL2 includes a third portion with a same shape, arrangement and position as the third portion CL1c that is connected to the second portion of the second crack line CL2, but is spaced apart below the third portion CL1c in the third direction DR3.

The second crack line CL2 may be disposed in the first peripheral area 100N1. When viewed in the plane, a portion of the second crack line CL2 may surround at least a portion of the active area 100A. The other portion of the second crack line CL2 may surround at least a portion of the pattern hole 100H.

In an embodiment, the second crack line CL2 is disposed under the first crack line CL1. For example, the second crack line CL2 may be spaced apart from the first crack line CL1 in the third direction DR3 in the first area AA1 and the bending area BA. Different from the present disclosure, in a case where not a single line but plural lines are arranged in parallel to each other when viewed in a plan view to inspect a defect of the display device 1000 (refer to FIG. 1), a size of the first peripheral area (100N1) may be increased. However, according to the present disclosure, the second crack line CL2 is disposed under the first crack line CL1 to overlap the first crack line CL1. For example, the second crack line CL2 may be disposed under the first crack line CL1 in a plan view so that only the first crack line CL1 is visible in the first area AA1 and the bending area BA when looking down towards a top surface of the display device 100 and only the second crack line CL2 is visible in the first area AA1 and the bending area BA when looking up towards a bottom surface of the display device 100. When each of the first crack line CL1 and the second crack line CL2 are provided as a single line, the size of the first peripheral area 100N1 may be decreased. Accordingly, a size of the peripheral area 1000N (refer to FIG. 1) of the display device 1000 (refer to FIG. 1) may be decreased.

When viewed in a plane or a plan view, the first crack line CL1 and the second crack line CL2 may overlap each other in the first area AA1 and the bending area BA. In an embodiment, the first crack line CL1 and the second crack line CL2 do not overlap each other in the second area AA2. Ends of the second crack line CL2 may be connected to the pads DP-PD. In an embodiment, the first crack line CL1 and the second crack line CL2 are spaced apart from one another in the third direction DR3 in the first area AA1 and the bending area BA.

In an embodiment, the first crack line CL1 has a resistance higher than that of the second crack line CL2.

The display device 1000 (refer to FIG. 1) may further include a circuit board PCB electrically connected to the display layer 100. The circuit board PCB may be a rigid circuit board or a flexible circuit board.

A timing control circuit may be disposed on the circuit board PCB to control an operation of the display layer 100. In addition, an input sensing circuit may be disposed on the circuit board PCB to control the sensor layer 200 (refer to FIG. 2A). Each of the timing control circuit and the input sensing circuit may be mounted on the circuit board PCB in the form of an integrated chip, however, this is merely an example. According to an embodiment, the timing control circuit and the input sensing circuit may be integrated in a single chip and may be mounted on the circuit board PCB.

The circuit board PCB may include a plurality of circuit pads PCB-PD electrically connected to the pads DP-PD of the display layer 100. Although not shown in figures, the circuit board PCB may further include signal lines connecting the circuit pads PCB-PD to the timing control circuit and/or the input sensing circuit.

Figure 5:
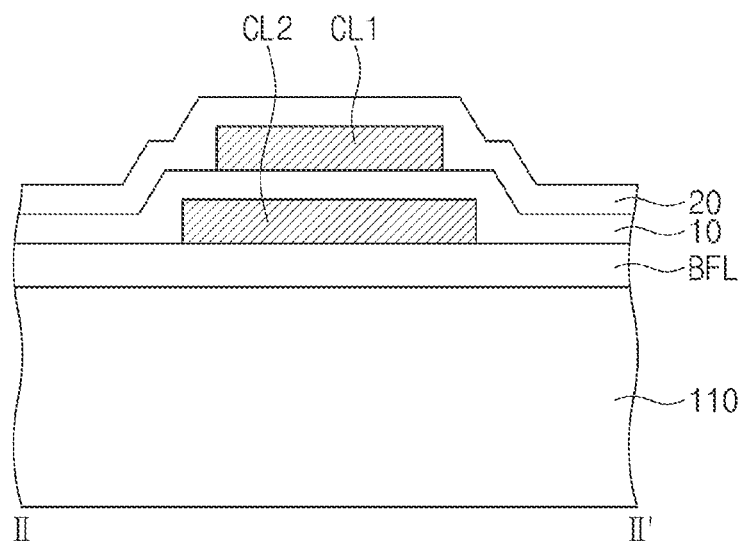
FIG. 5 is a cross-sectional view taken along a line II-IF of FIG. 4 according to an embodiment of the present disclosure.
Figure 5:
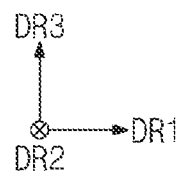

FIG. 5 is a cross-sectional view taken along a line II-IF of FIG. 4 according to an embodiment of the present disclosure. In FIG. 5, the same reference numerals denote the same elements in FIG. 3, and thus, detailed descriptions of the same elements will be omitted.

Referring to FIG. 5, the buffer layer BFL may be disposed on the base layer 110. The second crack line CL2 may be disposed on the buffer layer BFL. The first insulating layer 10 may be disposed on the buffer layer BFL and the second crack line CL2.

The first crack line CL1 may be disposed on the first insulating layer 10. That is, the first insulating layer 10 may be disposed between the first crack line CL1 and the second crack line CL2. The first crack line CL1 and the second crack line CL2 may be insulated from each other by the first insulating layer 10.

At least one of the first crack line CL1 and the second crack line CL2 may be disposed on the same layer as the transistor 100PC (refer to FIG. 3), however, this is merely an example. According to an embodiment, a position of the first crack line CL1 and the second crack line CL2 is not limited thereto. At least one of the first crack line CL1 and the second crack line CL2 may be formed through the same process as the transistor 100PC (refer to FIG. 3) and may include the same material as the transistor 100PC (refer to FIG. 3).

The second insulating layer 20 may be disposed on the first crack line CL1, however, this is merely an example. According to an embodiment, an arrangement relationship between the first crack line CL1 and the second crack line CL2 is not limited thereto. As an example, the first crack line CL1 may be disposed on the first insulating layer 10, and the second insulating layer 20 may be disposed between the first crack line CL1 and the second crack line CL2.

When viewed in a plan view, the first crack line CL1 may overlap the second crack line CL2.

Figure 6:
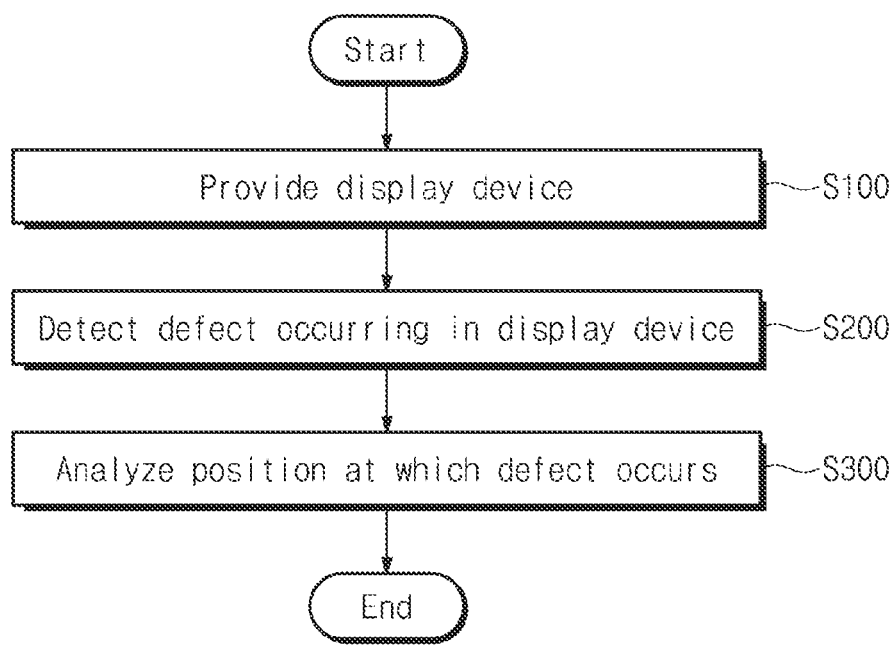
FIG. 6 is a flowchart of a method of inspecting a display device according to an embodiment of the present disclosure.
Figure 7A:
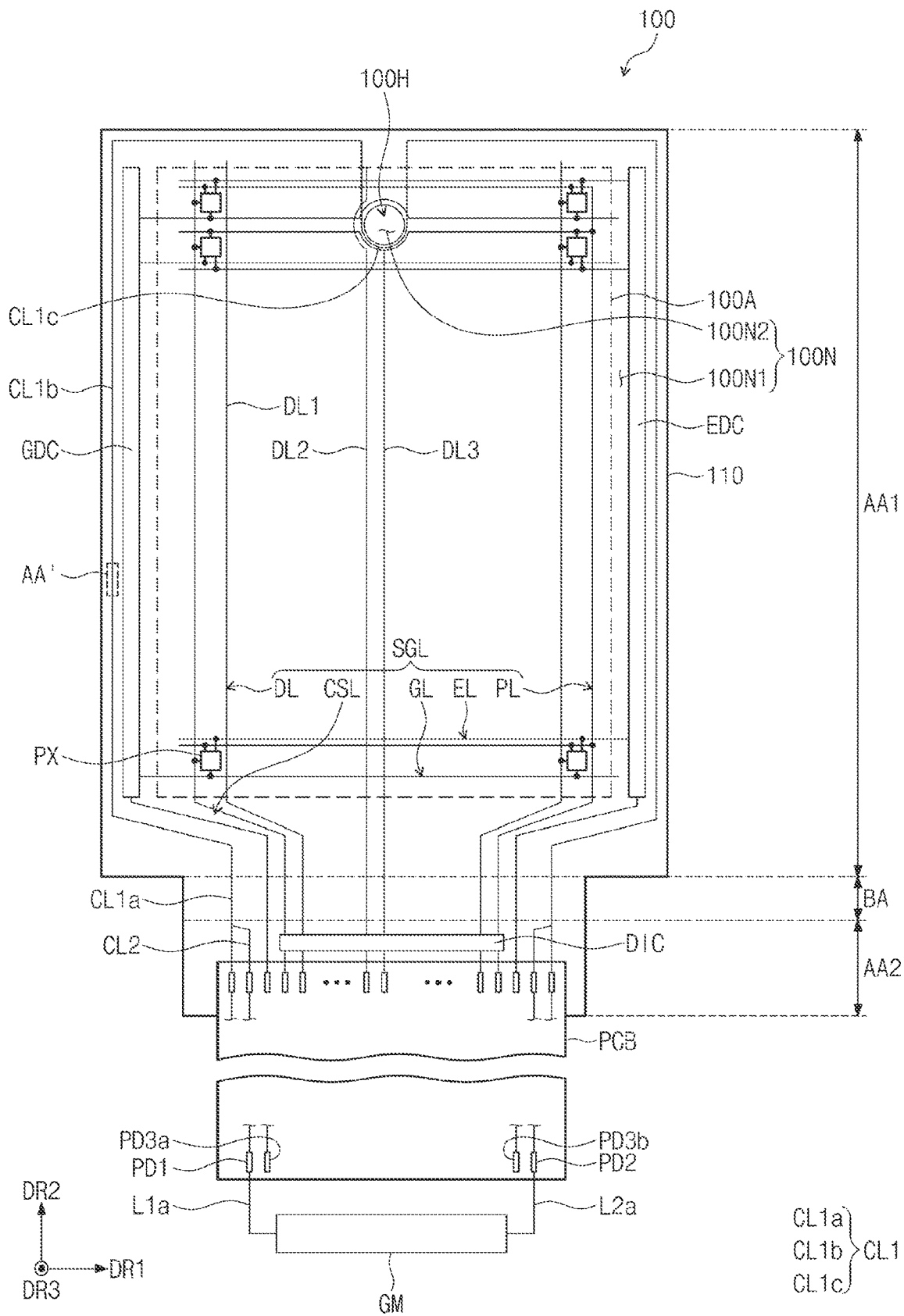
FIG. 7A is a plan view of a display layer according to an embodiment of the present disclosure.
Figure 7B:
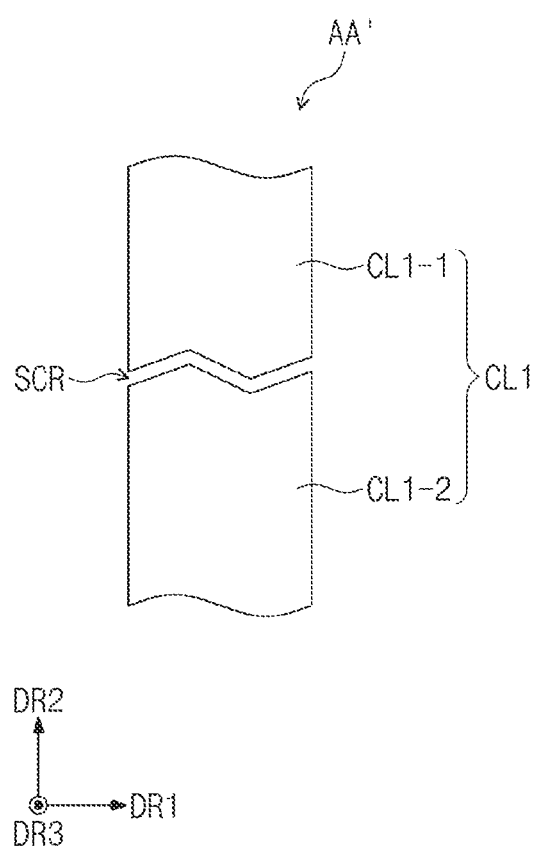
FIG. 7B is an enlarged plan view of an area AA' of FIG. 7A according to an embodiment of the present disclosure.

FIG. 6 is a flowchart of a method of inspecting the display device according to an embodiment of the present disclosure. FIG. 7A is a plan view of a display layer according to an embodiment of the present disclosure, and FIG. 7B is an enlarged plan view of an area AA' of FIG. 7A according to an embodiment of the present disclosure. In FIG. 7A, the same reference numerals denote the same elements in FIG. 4, and thus, detailed descriptions of the same elements will be omitted.

Referring to FIGS. 6 to 7B, a defect occurring in a process of manufacturing the display device 1000 (refer to FIG. 1) is inspected using the inspection method of the display device 1000 (refer to FIG. 1).

The display device 1000 (refer to FIG. 1) may be provided to be connected to a detector GM (S100). For example, as shown in FIG. 7A, the detector GM (e.g., a voltage, current, and/or resistance detector) may be electrically connected to the display device 1000 (refer to FIG. 1) via a first line L1a and a second line L2a.

The circuit board PCB may further include a first inspection pad PD1, a second inspection pad PD2, and a plurality of ground pads PD3a and PD3b. In an embodiment, the first inspection pad PD1 is electrically connected to one end of the first crack line CL1. In an embodiment, the second inspection pad PD2 is electrically connected to the other end of the first crack line CL1. In an embodiment, the ground pads PD3a and PD3b are electrically connected to the second crack line CL2.

The first line L1a may be electrically connected to the first inspection pad PD1. The second line L2a may be electrically connected to the second inspection pad PD2.

The detector GM may detect a defect occurring in the display device 1000 (refer to FIG. 1) based on data detected from at least one of the first crack line CL1 and the second crack line CL2 (S200). The detecting of the defect may include detecting a first defect SCR of the first crack line CL1 based on the first crack line CL1.

The first defect SCR may be a defect generated in the manufacturing process of the display device 1000 (refer to FIG. 1) and occurring on a plane defined by the first direction DR1 and the second direction DR2. As an example, the first defect SCR may include scratches.

The first defect SCR may be formed on the first crack line CL1. The first crack line CL1 may be divided into a first crack portion CL1-1 and a second crack portion CL1-2 by the first defect SCR. The first crack portion CL1-1 may be spaced apart from the second crack portion CL1-2 in the second direction DR2.

In the case where the first defect SCR occurs in the first crack line CL1, the first crack portion CL1-1 and the second crack portion CL1-2 may be electrically open with respect to each other. That is, the first line L1a and the second line L2a may be electrically open with respect to each other. For example, the first defect SCR could represent a break in the first crack line CL1.

According to the present disclosure, the detector GM may be electrically connected to both ends of the first crack line CL1 and may measure a current and/or a resistance. In a case where an open current and/or an open resistance is measured, the detector GM may determine that the first defect SCR occurs in the display device 1000 (refer to FIG. 1). The open current may refer to a current lower than a current in a normal state. The open resistance may refer to a resistance higher than a resistance in the normal state. Accordingly, a reliability of the defect inspection of the display device 1000 (refer to FIG. 1) and the inspection method of the display device 1000 (refer to FIG. 1) may be increased.

Figure 8A:
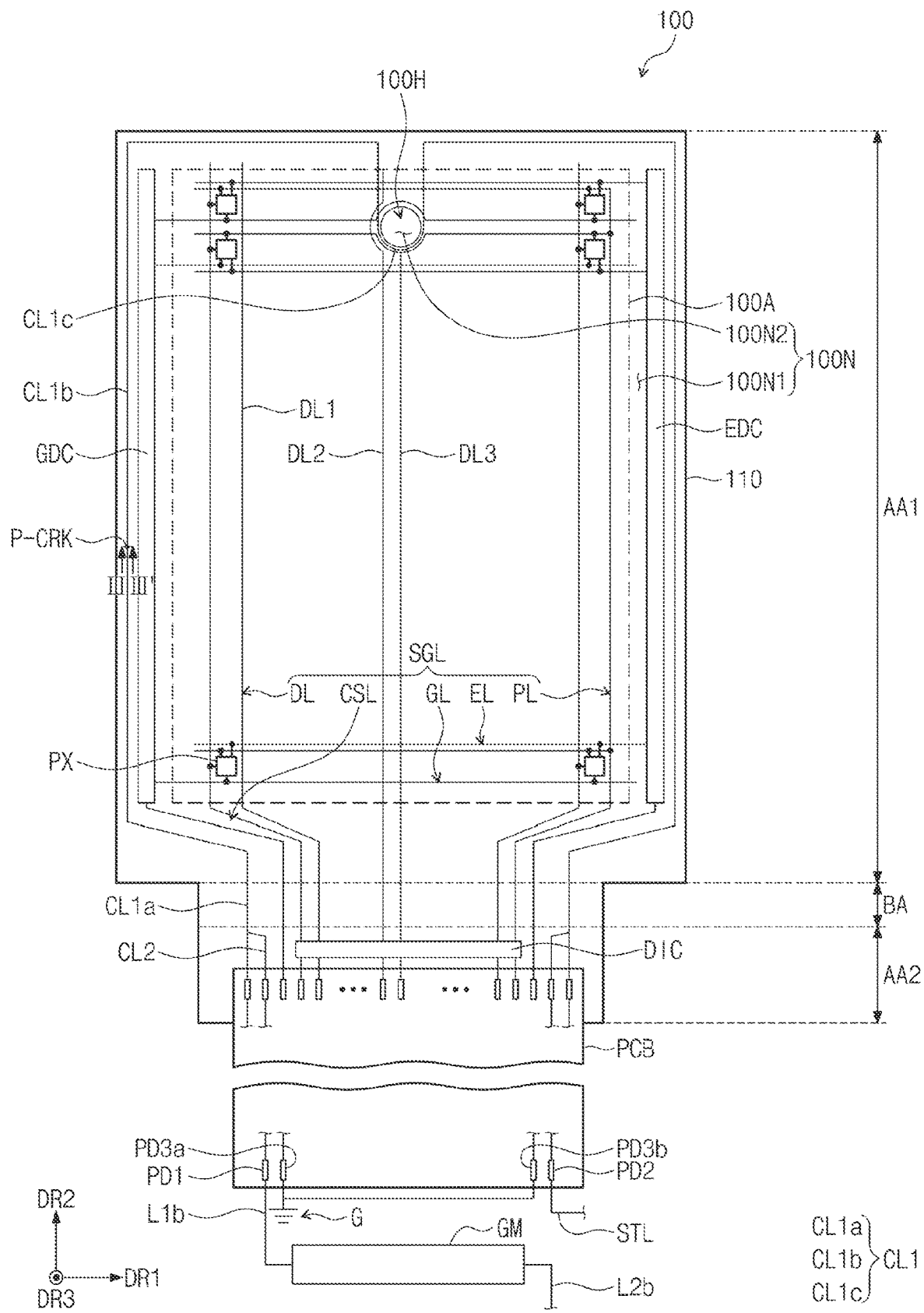
FIG. 8A is a plan view of a display layer according to an embodiment of the present disclosure.

FIG. 8A is a plan view of a display layer according to an embodiment of the present disclosure. In FIG. 8A, the same reference numerals denote the same elements in FIG. 4, and thus, detailed descriptions of the same elements will be omitted.

Figure 8B:
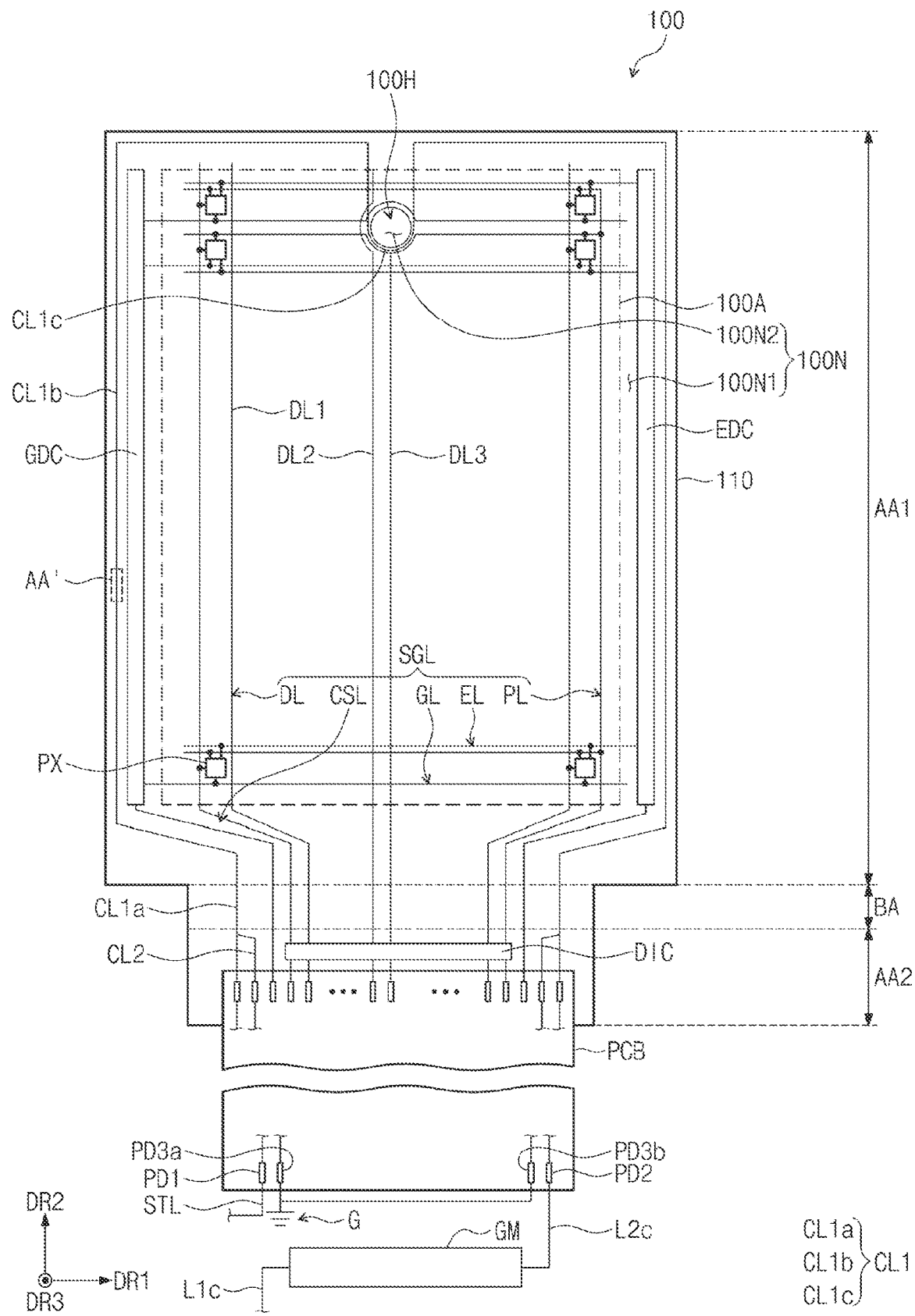
FIG. 8B is a plan view of a display layer according to an embodiment of the present disclosure.

Referring to FIGS. 6 and 8A to 8B, the defect occurring in a manufacturing process of the display device 1000 (refer to FIG. 1) may be inspected using the inspection method of the display device 1000 (refer to FIG. 1).

The display device 1000 (refer to FIG. 1) may be provided to be connected to a detector GM (S100). The detector GM may be electrically connected to the display device 1000 (refer to FIG. 1) via a first line L1b and a second line L2b.

The circuit board PCB may further include the first inspection pad PD1, the second inspection pad PD2, and the ground pads PD3a and PD3b. The first inspection pad PD1 may be electrically connected to one end of the first crack line CL1. The second inspection pad PD2 may be electrically connected to the other end of the first crack line CL1. The ground pads PD3a and PD3b may be electrically connected to the second crack line CL2.

The first line L1b may be electrically connected to the first inspection pad PD1.

In an embodiment, the second line L2b is connected to one end of a resistor having a same length (or resistance) as that of the first crack line CL1. As an example, the second line L2b may be electrically connected to a first inspection pad PD1 of another display device 1000 (refer to FIG. 1) in which no defect occurs.

As shown in FIG. 8A, the second inspection pad PD2 is electrically connected to a short-circuit line STL. In an embodiment, the short-circuit line STL is connected to the other end of the resistor having the same length (or resistance) as that of the first crack line CL1. As an example, the second inspection pad PD2 may be electrically connected to a second inspection pad PD2 of the another display device 1000 (refer to FIG. 1).

The ground pads PD3a and PD3b may be connected to a ground voltage G.

FIG. 8B is a plan view of a display layer according to an embodiment of the present disclosure. In FIG. 8B, the same reference numerals denote the same elements in FIG. 8A, and thus, detailed descriptions of the same elements will be omitted.

Referring to FIG. 8B, a first line L1c may be connected to one end of a resistor having the same length (or resistance) as that of the first crack line CL1. As an example, the first line L1c may be electrically connected to a second inspection pad PD2 of another display device 1000 (refer to FIG. 1) in which no defect occurs.

A second line L2c may be electrically connected to the second inspection pad PD2.

As shown in FIG. 8B, the first inspection pad PD1 is electrically connected to a short-circuit line STL. In an embodiment, the short-circuit line STL is connected to the resistor having the same length (or resistance) as that of the first crack line CL1. As an example, the first inspection pad PD1 may be electrically connected to a first inspection pad PD1 of the another display device 1000 (refer to FIG. 1).

The ground pads PD3a and PD3b may be connected to the ground voltage G.

Figure 9:
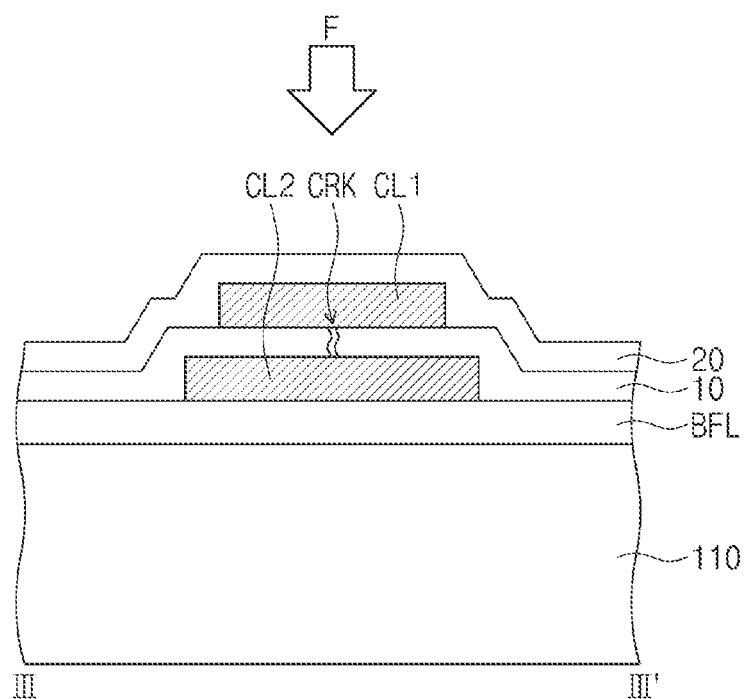
FIG. 9 is a cross-sectional view taken along a line III-III' of FIG. 8A according to an embodiment of the present disclosure.

FIG. 9 is a cross-sectional view taken along a line III-III' of FIG. 8A according to an embodiment of the present disclosure.

Referring to FIGS. 8A and 9, the detector GM may detect a defect occurring in the display device 1000 (refer to FIG. 1) based on data detected from at least one of the first crack line CL1 and the second crack line CL2 (S200). The detecting of the defect may include detecting a second defect CRK of the insulating layer 10 disposed between the first crack line CL1 and the second crack line CL2 based on the first crack line CL1 and the second crack line CL2.

The second defect CRK may be a defect occurring due to a force F generated in the manufacturing process of the display device 1000 (refer to FIG. 1) and applied in a direction substantially parallel to the third direction DR3. The force F may include a force caused by a laser process, a force by a lamination process, and/or a force by a bending process, which are generated in the manufacturing process of the display device 1000 (refer to FIG. 1). As an example, the second defect CRK may include a crack.

The second defect CRK may occur in the insulating layer 10. In the case where the second defect CRK occurs, the first crack line CL1 may be electrically connected to the second crack line CL2. For example, the force F could cause the first crack line CL1 to move towards the second crack line CL2 and create a break in the insulating layer 10 that allows the first crack line CL1 to electrically contact the second crack line CL2 through the created break.

In the case where the second defect CRK occurs in the insulating layer 10, the first crack line CL1 and the second crack line CL2 may be electrically short-circuited. The first crack line CL1 may be electrically connected to the second crack line CL2 connected to the ground voltage G at a position P-CRK (e.g., see FIG. 10) where the second defect CRK occurs. That is, the first crack line CL1 may be grounded at the position P-CRK where the second defect CRK occurs.

According to the present disclosure, the detector GM may be electrically connected to both ends of the first crack line CL1 and may measure a current and/or a resistance. In a case where a short-circuit current and/or a short-circuit resistance are measured, the detector GM may determine that the second defect CRK occurs in the display device 1000 (refer to FIG. 1). The short-circuit current may refer to a current higher than a current in a normal state. The short-circuit resistance may refer to a resistance lower than a resistance in the normal state. Accordingly, a reliability of the defect inspection of the display device 1000 (refer to FIG. 1) and the inspection method of the display device 1000 (refer to FIG. 1) may be increased.

In a case where the detector GM is connected to the display device 1000 (refer to FIG. 1) according to the embodiment of FIG. 8A, the second defect CRK occurring in the second portion CL1b adjacent to the scan driver GDC may be easily measured.

In a case where the detector GM is connected to the display device 1000 (refer to FIG. 1) according to the embodiment of FIG. 8B, the second defect CRK occurring in the second portion CL1b adjacent to the light emission driver EDC may be easily measured.

Figure 10:
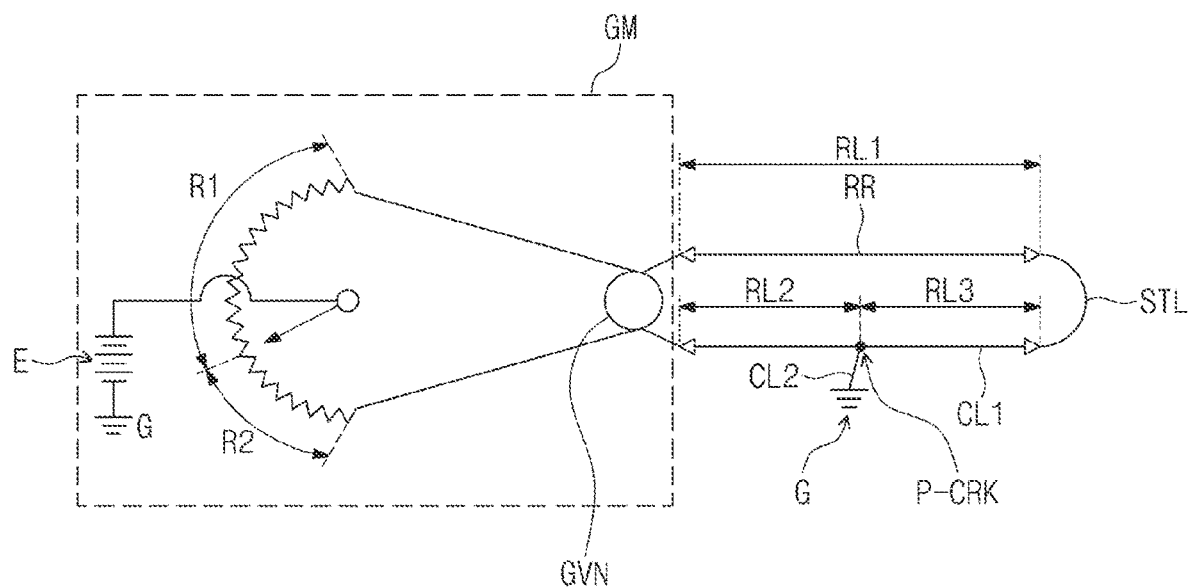
FIG. 10 is a view explaining a method of locating a defect using a Murray loop test according to an embodiment of the present disclosure.
Figure 11:
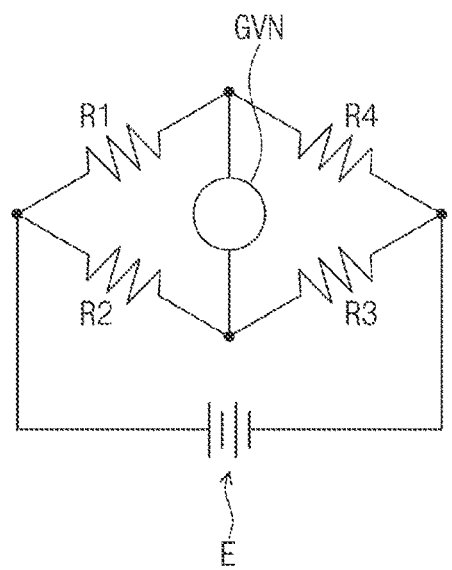
FIG. 11 is circuit diagram of a Wheatstone bridge according to an embodiment of the present disclosure.

FIG. 10 is a view explaining a method of locating a defect using a Murray loop test according to an embodiment of the present disclosure, and FIG. 11 is circuit diagram of a Wheatstone bridge according to an embodiment of the present disclosure.

Referring to FIGS. 8A to 11, the display device 1000 (refer to FIG. 1) and the detector GM may analyze the position P-CRK at which the second defect CRK occurs using a Murray loop test.

In an embodiment, the detector GM includes a variable resistor including a first resistor R1 and a second resistor R2 and a power supply E. One end of the power supply E may be electrically connected to the ground voltage G.

The detector GM may be connected to at least one display device 1000 (refer to FIG. 1) to form the Wheatstone bridge. The detector GM may analyze the position P-CRK at which the second defect CRK occurs based on the Wheatstone bridge (S300, refer to FIG. 6).

As an example, the first crack line CL1 in which the second defect CRK occurs may be connected to one end of a resistor RR having the same length (or resistance) as that of the first crack line CL1 using the short-circuit line STL as shown in FIG. 8A. The display device 1000 (refer to FIG. 1) may be electrically connected to the detector GM including the variable resistors R1 and R2 and applying power of the power supply E. The display device 1000 (refer to FIG. 1) and the detector GM may form the Wheatstone bridge.

The first crack line CL1 may be electrically connected to the second crack line CL2 connected to the ground voltage G at the position P-CRK where the second defect CRK occurs.

A galvanometer GVN may detect a potential difference of a Wheatstone bridge circuit. In the state where power from the power supply E is applied, a pointer of a galvanometer GVN may be controlled to indicate zero (0) by adjusting the variable resistors R1 and R2. When the pointer of the galvanometer GVN indicates zero (0), the Wheatstone bridge circuit is in a balanced state.

When the Wheatstone bridge circuit in the balanced state, the variable resistors R1 and R2 of the detector GM may include the first resistor R1 and the second resistor R2. A third resistor R3 may be formed from the one end of the first crack line CL1 connected to the detector GM to the position P-CRK where the second defect CRK occurs. A fourth resistor R4 may be formed from the other end of the first crack line CL1 connected to the resistor RR and the short-circuit line STL to the position P-CRK where the second defect CRK occurs.

In an embodiment, the first crack line CL1 has a resistance value greater than that of the second crack line CL2. A current may easily flow from the first crack line CL1 to the second crack line CL2, and thus, the third resistor R3 and the fourth resistor R4 may be easily distinguished from each other.

The resistor RR may have a first length RL1. A length from the one end of the first crack line CL1 connected to the detector GM to the position P-CRK where the second defect CRK occurs may have a second length RL2. A length from the other end of the first crack line CL1 connected to the short-circuit line STL to the position P-CRK where the second defect CRK occurs may have a third length RL3. In this case, since the resistor RR has the same length as that of the first crack line CL1, the first length RL1 may be the same as a sum of the second length RL2 and the third length RL3.

A resistance value of the third resistor R3 and the fourth resistor R4 may be obtained by the expression of rL/A. In the expression, r denotes a specific resistance, L denotes a length of a resistor, and A denotes a cross-sectional area of the resistor.

The resistance value of the third resistor R3 and the fourth resistor R4 may be proportional to the length of the resistor. The resistance value of the third resistor R3 may be proportional to the second length RL2.

The resistance value of the fourth resistor R4 may be a sum of the first length RL1 and the third length RL3. In this case, the length of the short-circuit line STL may be negligibly small. The third length RL3 may be the same as a length obtained by subtracting the second length RL2 from the first length RL1. That is, a resistance value of the fourth resistor R4 may have a value obtained by subtracting the second length RL2 from twice the first length RL1.

When the Wheatstone bridge circuit in the balanced state, a value obtained by multiplying resistance values of resistors facing each other may be the same as a value obtained by multiplying resistance values of the other resistors facing each other. A value obtained by multiplying a resistance value of the first resistor R1 by a resistance value of the third resistor R3 may be the same as a value obtained by multiplying the second resistor R2 by the fourth resistor R4. That is, a value obtained by multiplying the first resistor R1 by the second length RL2 may be the same as a value obtained by multiplying the second resistor R2 by the value obtained by subtracting the second length RL2 from twice the first length RL1. Accordingly, a first equation of R1×RL2=R2×(2×RL1−RL2) may be satisfied.

The second equation with respect to the second length RL2 may be derived based on the first equation. That is, the second length RL2 may satisfy a second equation of RL2=(2×R2×RL1)/(R1+R2). The resistance values of the first resistor R1 and the second resistor R2 may be obtained by the measurement of the detector GM. The first length RL1 may be obtained from the length of the first crack line CL1 measured in advance. Accordingly, the second length RL2 that is a distance from the first inspection pad PD1 or the second inspection pad PD2 to the position P-CRK where the second defect CRK occurs may be obtained based on the second equation. The position P-CRK where the second defect CRK occurs may be calculated based on the second length RL2.

As an example, in a case where the second defect CRK occurs in the insulating layer 10 disposed under the first portion CL1a, the detector GM may detect that the second defect CRK occurs in the bending area BA based on the second length RL2. When it is determined that the second defect CRK occurs in the bending process of the manufacturing process of the display device 1000 (refer to FIG. 1), the bending process may be corrected to prevent the second defect CRK from occurring.

In a case where the second defect CRK occurs in the insulating layer 10 disposed under the second portion CL1b, the detector GM may detect that the second defect CRK occurs in an outermost portion of the long side of the first area AA1 extending in the second direction DR2. When the second defect CRK occurs in an outermost portion of the long side of the first area AA1 extending in the second direction DR2, it may be determined that the second defect CRK occurs in a laser process and/or a lamination process of the manufacturing process of the display device 1000 (refer to FIG. 1). Then, the laser process and/or the lamination process may be corrected to prevent the second defect CRK from occurring.

In a case where the second defect CRK occurs in the insulating layer 10 disposed under the third portion CL1c, the detector GM may detect that the second defect CRK occurs in an outermost portion of the short side of the first area AA1 extending in the first direction DR1 or in the second peripheral area 100N2. In this case, it may be determined that the second defect CRK occurs in the laser process and/or the lamination process of the manufacturing process of the display device 1000 (refer to FIG. 1), and then, the laser process and/or the lamination process may be corrected to prevent the second defect CRK from occurring.

According to the present disclosure, a user may inspect the display device 1000 for a defect (refer to FIG. 1) to reduce a process defect rate of the display device 1000 (refer to FIG. 1). The position P-CRK where the second defect CRK occurs may be accurately found out based on the second length RL2. Accordingly, the reliability of the defect inspection of the display device 1000 (refer to FIG. 1) and the inspection method of the display device may be increased. In addition, the manufacturing process may be specifically corrected to prevent the second defect CRK from later occurring at the position P-CRK. Accordingly, the reliability of the manufacturing process of the display device 1000 (refer to FIG. 1) and the inspection method of the display device may be increased.

In addition, the detector GM may detect a position where excessive heat is generated in the first crack line CL1. As an example, the detector GM may include a thermal imaging camera. The power supply E may provide a variable voltage. The position P-CRK where the second defect CRK occurs may be detected based on the position where the excessive heat is generated. For example, the excessive heat is generated when a temperature detected by the thermal imaging camera exceeds a threshold. In the case where the second defect CRK occurs in the insulating layer 10, a leakage current may be generated in a short circuit when a voltage is applied to the first crack line CL1, and the excessive heat caused by the leakage current may be generated in the position P-CRK.

According to an embodiment of the present disclosure, the insulating layer 10 may be disposed under the first crack line CL1 and the second crack line CL2 may be disposed under the insulating layer 10. The second crack line CL2 may be electrically connected to the ground voltage G, and the leakage current may be generated from the first crack line CL1 to the second crack line CL2 due to the second defect CRK generated in the insulating layer 10. The excessive heat may be generated by the leakage current. The detector GM may detect the position P-CRK where the second defect CRK occurs based on the position where the excessive heat is generated. Accordingly, the reliability of the defect inspection of the display device 1000 (refer to FIG. 1) and the inspection method of the display device may be increased.

According to an exemplary embodiment, a display device is provided that is capable of being interfaced with a detector that enables the detector to determine whether a defect such as a crack or break is present in the display device. The display device includes a display layer having active area in which a plurality of pixels is arranged and a peripheral area located adjacent to the active area. The display layer includes a first crack line disposed in the peripheral area and surrounding a portion of the active area and a second crack line disposed in the peripheral area under and insulated from the first crack line.

Although embodiments of the present disclosure have been described, it is understood that the present disclosure should not be limited to these embodiments but various changes and modifications can be made by one ordinary skilled in the art within the spirit and scope of the present disclosure as hereinafter claimed.

What is claimed is:

1. A display device comprising:
a display layer comprising an active area in which a plurality of pixels is arranged and a peripheral area located adjacent to the active area,
the display layer comprising:
a transistor disposed in the active area and comprising a gate, a source, and a drain;
a first crack line disposed in the peripheral area on a same layer as the gate and surrounding a portion of the active area in a plan view; and
a second crack line disposed in the peripheral area under the first crack line to overlap the first crack line in the plan view,
wherein the first crack line is insulated from the second crack line.

2. The display device of claim 1, wherein the layer is an insulating layer disposed between the first crack line and the second crack line.

3. The display device of claim 1, wherein the second crack line surrounds the portion of the active area in the plan view.

4. The display device of claim 1, wherein the display layer further comprises a driving circuit electrically connected to the transistor, the peripheral area comprises a first area, a second area spaced apart from the first area in a first direction, and a bending area disposed between the first area and the second area, the first area is located adjacent to the active area, and the driving circuit is disposed in the second area.

5. The display device of claim 4, wherein each of the first crack line and the second crack line is disposed in the first area, the second area, and the bending area.

6. A display device comprising:
a display layer comprising an active area in which a plurality of pixels is arranged and a peripheral area located adjacent to the active area,
the display layer comprising:
- a transistor disposed in the active area and comprising a gate, a source, and a drain;
- a first crack line disposed in the peripheral area and surrounding a portion of the active area in a plan view; and
- a second crack line disposed in the peripheral area under the first crack line, wherein the first crack line is insulated from the second crack line, and
wherein the active area includes a pattern hole, and the first crack line surrounds a portion of the pattern hole.

7. A display device comprising:
a display layer comprising an active area in which a plurality of pixels is arranged and a peripheral area located adjacent to the active area; and
a sensor layer disposed on the display layer, sensing an external input, and comprising a plurality of conductive layers,
the display layer comprising:
- a transistor disposed in the active area and comprising a gate, a source, and a drain;
- a first crack line disposed in the peripheral area and surrounding a portion of the active area in a plan view; and
- a second crack line disposed in the peripheral area under the first crack line,
  wherein the first crack line is insulated from the second crack line.

8. A method of inspecting a display device, comprising:
providing a display device comprising a display layer comprising an active area in which a plurality of pixels is arranged and a peripheral area located adjacent to the active area, the display layer comprising a transistor disposed in the active area and comprising a gate, a source, and a drain, a first crack line disposed in the peripheral area and surrounding a portion of the active area in a plan view, a second crack line disposed in the peripheral area under the first crack line, and an insulating layer disposed between the first crack line and the second crack line;
detecting whether a defect occurs in the display device based on at least one of the first crack line and the second crack line; and
analyzing a position where the defect occurs based on a Wheatstone bridge.

9. The method of claim 8, wherein the analyzing of the position of the defect is performed using a Murray loop test.

10. The method of claim 8, further comprises: detecting whether a first defect of the first crack line has occurred based on the first crack line; and detecting whether a second defect of the insulating layer has occurred based on the first crack line and the second crack line.

11. The method of claim 10, wherein the analyzing of the position of the defect comprises analyzing a position of the second defect occurring in the insulating layer.

12. The method of claim 8, wherein the analyzing of the position of the defect comprises electrically connecting a Murray loop tester to the first crack line.

13. The method of claim 8, wherein the analyzing of the position of the defect comprises connecting the second crack line to a ground voltage.

14. The method of claim 8, wherein the analyzing of the position of the defect comprises detecting a position where excessive heat is generated in the first crack line.

15. A method of inspecting a display device, comprising:
providing a display device comprising a display layer comprising an active area in which a plurality of pixels is arranged and a peripheral area located adjacent to the active area, the display layer comprising a first crack line disposed in the peripheral area and surrounding a portion of the active area in a plan view, and a second crack line disposed in the peripheral area under the first crack line;
detecting whether a defect occurs in the display layer based on the first crack line and the second crack line; and
analyzing a position where the defect occurs based on a Murray loop test.

16. The method of claim 15, wherein the analyzing of the position of the defect comprises connecting the second crack line to a ground voltage.

17. The method of claim 15, wherein the analyzing of the position of the defect comprises:
connecting the first crack line to a detector; and
allowing the first crack line and the detector to form a Wheatstone bridge.

18. The method of claim 15, wherein the analyzing of the position of the defect comprises detecting a position where excessive heat is generated in the first crack line.

* * * * *